(12) United States Patent
Wu et al.

(10) Patent No.: US 7,668,420 B2
(45) Date of Patent: Feb. 23, 2010

(54) OPTICAL WAVEGUIDE RING RESONATOR WITH AN INTRACAVITY ACTIVE ELEMENT

(75) Inventors: Wei Wu, Mountain View, CA (US); Shih-Yuan Wang, Palo Alto, CA (US); Michael Renne Ty Tan, Menlo Park, CA (US); David A. Fattal, Mountain View, CA (US); Charles M. Santori, Palo Alto, CA (US); Raymond G. Beausoleil, Redmond, WA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/829,048

(22) Filed: Jul. 26, 2007

(65) Prior Publication Data

US 2009/0028492 A1    Jan. 29, 2009

(51) Int. Cl.
    *G02B 6/26*    (2006.01)
(52) U.S. Cl. .......................................... 385/32; 385/14
(58) Field of Classification Search ............. 385/27–28; 356/437; 372/92
    See application file for complete search history.

(56) References Cited

U.S. PATENT DOCUMENTS

| | | | | |
|---|---|---|---|---|
| 3,581,227 A | * | 5/1971 | Podgorski | 372/94 |
| 3,744,908 A | * | 7/1973 | Podgorski | 356/472 |
| 4,002,997 A | * | 1/1977 | Thompson | 372/50.123 |
| 4,420,873 A | | 12/1983 | Leonberger et al. | |
| 4,481,635 A | * | 11/1984 | Broberg et al. | 372/94 |
| 4,548,501 A | * | 10/1985 | Smith et al. | 356/467 |
| 4,632,555 A | * | 12/1986 | Malvern | 356/472 |
| 4,685,107 A | * | 8/1987 | Kafka et al. | 372/6 |
| 4,712,917 A | * | 12/1987 | Bergstrom et al. | 356/468 |
| 4,821,282 A | * | 4/1989 | Podgorski | 372/99 |
| 4,949,358 A | * | 8/1990 | Kantorski et al. | 372/94 |
| 4,955,034 A | * | 9/1990 | Scerbak | 372/94 |
| 5,006,906 A | | 4/1991 | Deri | |
| 5,088,824 A | * | 2/1992 | Killpatrick et al. | 356/459 |

(Continued)

FOREIGN PATENT DOCUMENTS

JP    03109786 A  *  5/1991

(Continued)

OTHER PUBLICATIONS

Alexander W. Fang et al.,"Electrically pumped hybrid AlGaInAs-silicon evanescent laser", Optics Express, Oct. 2, 2006, vol. 14, No. 20, pp. 9203-9210 pages.

*Primary Examiner*—Frank G Font
*Assistant Examiner*—Peter Radkowski

(57) ABSTRACT

An optical resonator, a photonic system and a method of optical resonance employ optical waveguide segments connected together with total internal reflection (TIR) mirrors to form a closed loop. The optical resonator includes the optical waveguide segments, an intracavity active element coupled to a designated one of the optical waveguide segments, the TIR mirrors and a photo-tunneling input/output (I/O) port. The photo-tunneling I/O port includes one of the TIR mirrors. The method includes propagating and reflecting the optical signal, or a portion thereof, in the optical resonator, transmitting a portion of the optical signal through the I/O port, and influencing the optical signal. The photonic system includes the optical resonator with optical gain and a source of an optical signal.

20 Claims, 5 Drawing Sheets

U.S. PATENT DOCUMENTS

| | | | |
|---|---|---|---|
| 5,127,016 A * | 6/1992 | Podgorski | 372/59 |
| 5,181,306 A * | 1/1993 | Guttner et al. | 29/413 |
| 5,263,111 A * | 11/1993 | Nurse et al. | 385/130 |
| 5,296,784 A * | 3/1994 | Geisler et al. | 315/111.41 |
| 5,313,488 A * | 5/1994 | Podgorski | 372/94 |
| 5,351,127 A * | 9/1994 | King et al. | 356/445 |
| 5,391,869 A * | 2/1995 | Ade et al. | 250/227.24 |
| 5,437,840 A * | 8/1995 | King et al. | 422/82.08 |
| 5,450,041 A * | 9/1995 | Halladay et al. | 331/96 |
| 5,548,602 A * | 8/1996 | Podgorski et al. | 372/19 |
| 5,581,643 A * | 12/1996 | Wu | 385/17 |
| 5,770,856 A * | 6/1998 | Fillard et al. | 250/234 |
| 5,786,925 A * | 7/1998 | Goossen et al. | 359/245 |
| 5,835,231 A * | 11/1998 | Pipino | 356/440 |
| 5,911,018 A * | 6/1999 | Bischel et al. | 385/16 |
| 5,943,136 A * | 8/1999 | Pipino et al. | 356/440 |
| 5,966,478 A * | 10/1999 | Marcuse et al. | 385/14 |
| 5,973,864 A * | 10/1999 | Lehmann et al. | 359/834 |
| 5,986,768 A * | 11/1999 | Pipino | 356/440 |
| 6,002,704 A * | 12/1999 | Freitag et al. | 372/94 |
| 6,056,696 A * | 5/2000 | Kallman | 600/459 |
| 6,080,467 A * | 6/2000 | Weber et al. | 428/212 |
| 6,097,555 A * | 8/2000 | Lehmann et al. | 359/834 |
| 6,108,478 A * | 8/2000 | Harpin et al. | 385/129 |
| 6,134,257 A * | 10/2000 | Capasso et al. | 372/94 |
| 6,172,823 B1 * | 1/2001 | Lehmann et al. | 359/834 |
| 6,172,824 B1 * | 1/2001 | Lehmann et al. | 359/834 |
| 6,356,679 B1 * | 3/2002 | Kapany | 385/18 |
| 6,389,197 B1 * | 5/2002 | Iltchenko et al. | 385/28 |
| 6,490,039 B2 * | 12/2002 | Maleki et al. | 356/436 |
| 6,507,681 B1 | 1/2003 | Kowalczyk et al. | |
| 6,515,749 B2 * | 2/2003 | Pipino | 356/440 |
| 6,563,997 B1 * | 5/2003 | Wu et al. | 385/130 |
| 6,566,155 B1 * | 5/2003 | Numai | 438/31 |
| 6,621,972 B2 * | 9/2003 | Kimerling et al. | 385/132 |
| 6,633,696 B1 * | 10/2003 | Vahala et al. | 385/27 |
| 6,665,330 B1 | 12/2003 | Numai | |
| 6,795,481 B2 | 9/2004 | Maleki et al. | |
| 6,823,098 B2 * | 11/2004 | Guidotti et al. | 385/17 |
| 6,879,752 B1 * | 4/2005 | Ilchenko et al. | 385/30 |
| 6,901,101 B2 * | 5/2005 | Frick | 372/92 |
| 6,920,253 B2 * | 7/2005 | Tan et al. | 385/1 |
| 6,928,223 B2 | 8/2005 | Walpole et al. | |
| 6,952,504 B2 * | 10/2005 | Bi et al. | 385/9 |
| 7,019,847 B1 * | 3/2006 | Bearman et al. | 356/517 |
| 7,043,115 B2 * | 5/2006 | Frick | 385/27 |
| 7,046,362 B2 * | 5/2006 | Lehmann et al. | 356/437 |
| 7,054,009 B2 * | 5/2006 | DePue et al. | 356/437 |
| 7,072,531 B2 | 7/2006 | Djordjev et al. | |
| 7,142,759 B2 | 11/2006 | Heideman et al. | |
| 7,177,492 B2 * | 2/2007 | Strecker | 385/14 |
| 7,206,470 B2 * | 4/2007 | Li et al. | 385/14 |
| 7,212,701 B2 * | 5/2007 | Strecker | 385/14 |
| 7,269,313 B2 * | 9/2007 | Yanik et al. | 385/27 |
| 7,283,707 B1 * | 10/2007 | Maleki et al. | 385/39 |
| 7,318,909 B2 * | 1/2008 | Lehmann et al. | 422/82.05 |
| 2001/0004411 A1 * | 6/2001 | Yariv | 385/28 |
| 2002/0079453 A1 * | 6/2002 | Tapalian et al. | 250/343 |
| 2002/0097401 A1 * | 7/2002 | Maleki et al. | 356/436 |
| 2002/0104482 A1 * | 8/2002 | Kazumi et al. | 118/723 R |
| 2002/0122179 A1 * | 9/2002 | Pipino | 356/440 |
| 2002/0122615 A1 * | 9/2002 | Painter et al. | 385/15 |
| 2002/0122644 A1 * | 9/2002 | Birks et al. | 385/125 |
| 2002/0181829 A1 * | 12/2002 | Margalit et al. | 385/14 |
| 2003/0007718 A1 * | 1/2003 | Bazylenko | 385/14 |
| 2003/0058908 A1 * | 3/2003 | Griffel | 372/43 |
| 2003/0107739 A1 * | 6/2003 | Lehmann et al. | 356/437 |
| 2003/0109055 A1 * | 6/2003 | Lehmann et al. | 436/164 |
| 2003/0117691 A1 * | 6/2003 | Bi et al. | 359/333 |
| 2003/0128917 A1 * | 7/2003 | Turpin et al. | 385/24 |
| 2004/0033020 A1 * | 2/2004 | LoCascio et al. | 385/37 |
| 2004/0037488 A1 * | 2/2004 | Guidotti et al. | 385/16 |
| 2004/0081386 A1 * | 4/2004 | Morse et al. | 385/15 |
| 2004/0118997 A1 * | 6/2004 | Lehmann et al. | 250/227.14 |
| 2004/0136433 A1 * | 7/2004 | Kuznetsov | 372/92 |
| 2004/0208454 A1 * | 10/2004 | Montgomery et al. | 385/50 |
| 2004/0208465 A1 * | 10/2004 | Logvin et al. | 385/129 |
| 2004/0258347 A1 * | 12/2004 | Gothoskar et al. | 385/14 |
| 2005/0040410 A1 * | 2/2005 | Ledentsov et al. | 257/79 |
| 2005/0117157 A1 * | 6/2005 | Tarsa | 356/437 |
| 2005/0180680 A1 * | 8/2005 | Kong | 385/14 |
| 2005/0189591 A1 * | 9/2005 | Gothoskar et al. | 257/347 |
| 2005/0238078 A1 * | 10/2005 | Pipino | 372/92 |
| 2005/0264811 A1 * | 12/2005 | Bi et al. | 356/338 |
| 2006/0183241 A1 * | 8/2006 | Lehmann et al. | 436/164 |
| 2006/0228074 A1 * | 10/2006 | Lipson et al. | 385/42 |
| 2007/0263224 A1 * | 11/2007 | Keyser et al. | 356/461 |

FOREIGN PATENT DOCUMENTS

JP          07030203 A *   1/1995

* cited by examiner

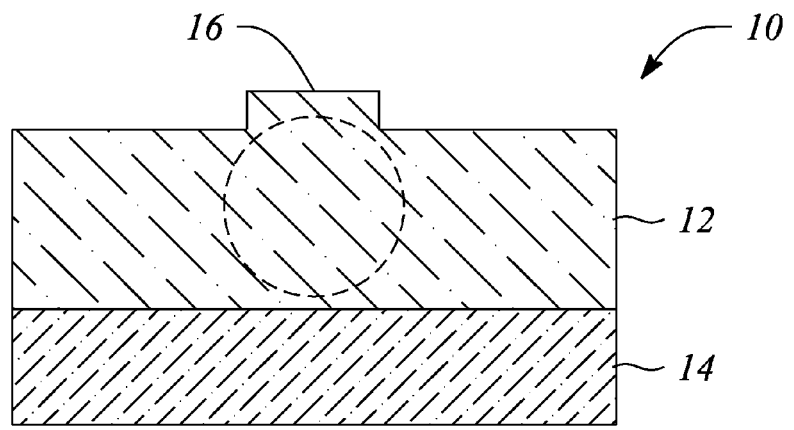
FIG. 1A  *Prior Art*
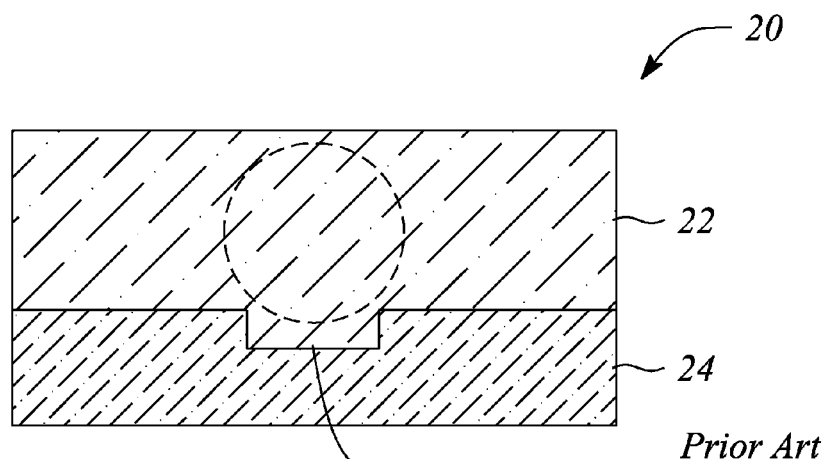
FIG. 1B  *Prior Art*
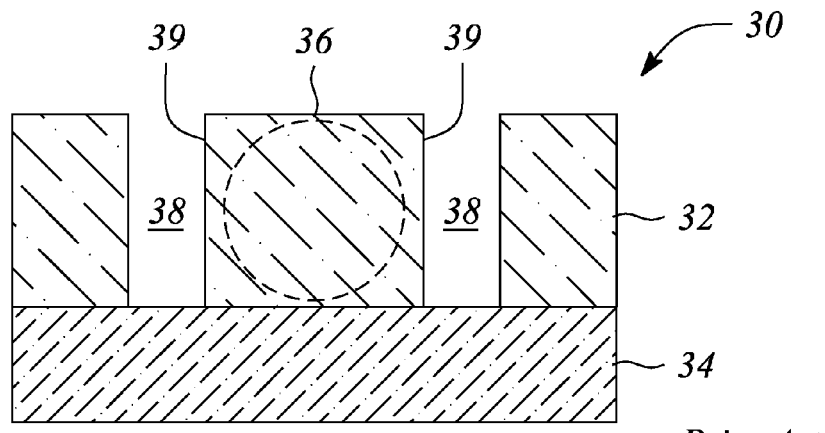
FIG. 1C  *Prior Art*

OPTICAL WAVEGUIDE RING RESONATOR WITH AN INTRACAVITY ACTIVE ELEMENT

CROSS-REFERENCE TO RELATED APPLICATIONS

The present invention is related to patent application of Wu et al., entitled "Optical Waveguide Ring Resonator with Photo-Tunneling Input/Output Port" Ser. No. 11/829042, filed concurrently herewith, which is incorporated by reference herein in its entirety.

STATEMENT REGARDING FEDERALLY SPONSORED RESEARCH OR DEVELOPMENT

N/A

BACKGROUND

1. Technical Field

The invention relates to optical waveguides and photonic circuits. In particular, the invention relates to optical waveguide resonators used in photonic devices and systems.

2. Description of Related Art

An optical ring resonator generally comprises a segment or segments of optical waveguide arranged as a closed loop or ring. The closed loop forms a resonant cavity. Such ring resonators have a variety of important uses in photonic devices and systems. In particular, the optical ring resonator may serve as an active photonic device having one or more active optical components or elements integrated within the resonant cavity of the ring resonator (i.e., an 'intracavity' active element(s)). The intracavity active element(s) integrated with the ring resonator may result in 'cavity enhancement' of a functionality of the active elements, for example. Such intracavity active elements may be employed to one or more of generate, amplify, and modulate an optical signal of the ring resonator.

The intracavity active elements that are integrated with a ring resonator may be generally classified as either saturable active elements or unsaturable active elements. Saturable active elements include, but are not limited to saturable absorbers, laser and other optical amplifiers. For example, the saturable active element may be a continuous-wave laser amplifier or a directly-modulated laser amplifier that is modulated by an applied electric current. In another example, the intracavity active elements may comprise a laser amplifier in combination with a saturable absorber. The saturable absorber may assist in mode-locking the laser within the resonant cavity (i.e., laser cavity) formed by the ring resonator, for example. An example of an unsaturable active element is an electro-absorption modulator (EAM). Incorporated into the resonant cavity of the ring resonator, the EAM becomes a 'cavity enhanced' EAM.

Among the challenges of integrating an intracavity active element into an optical ring resonator is providing sufficient coupling between the intracavity active optical element and a mode or modes of the optical signal propagating in the optical waveguide of the ring resonator. Generally, the coupling must be sufficient to provide for proper and/or efficient operation of the intracavity active optical element. For example, a modulation depth or ratio of an EAM is directly dependent on a percentage of the optical signal that is coupled into the EAM. Sufficient coupling may be difficult to achieve in many cases.

Another challenge of integrating an intracavity active optical element into an optical ring resonator is choosing appropriate materials for the integrated structure. Specifically, an ideal or highly desirable material for realizing the optical waveguide may be less than ideal for or even incompatible with an implementation of the intracavity active element. For example, while silicon may be a relatively attractive material (e.g., low cost) for realizing and implementing the optical waveguide of the optical resonator, silicon is an indirect band gap material and, as such, is not particularly well-suited for constructing active optical elements.

BRIEF SUMMARY

In some embodiments of the present invention, an optical resonator is provided. The optical resonator comprises a plurality of segments of an optical waveguide. The optical resonator further comprises an intracavity active element. The intracavity active element overlies and is optically coupled to a designated segment of the plurality of segments. The optical resonator further comprises a plurality of total internal reflection (TIR) mirrors. A number of TIR mirrors in the plurality of TIR mirrors is equal to a number of segments in the plurality of segments. The optical resonator further comprises a photo-tunneling input/output (I/O) port. The plurality of segments of the optical waveguide is arranged as a closed loop wherein successive pairs of the segments are connected to one another at respective segment ends by successive ones of the TIR mirrors. The photo-tunneling I/O port comprises a designated TIR mirror of the successive TIR mirrors of the plurality of TIR mirrors.

In other embodiments of the present invention, a photonic system is provided. The photonic system comprises an optical source that produces an optical signal and an optical resonator that receives the optical signal. The optical resonator comprises a plurality of segments of an optical waveguide, an intracavity active element, a plurality of total internal reflection (TIR) mirrors, and a photo-tunneling input output (I/O) port. The intracavity active element is optically coupled to a designated segment of the plurality of segments. A number of TIR mirrors in the plurality of TIR mirrors is equal to a number of segments in the plurality of segments. The plurality of segments of the optical waveguide is arranged as a closed loop. The TIR mirrors connect segment ends of respective successive pairs of the segments of the optical waveguide. The photo-tunneling I/O port comprises a designated TIR mirror of the plurality of TIR mirrors.

In other embodiments of the present invention, a method of optical resonance is provided. The method of optical resonance comprises propagating an optical signal along a plurality of segments of an optical waveguide. The segments of the plurality are arranged as a closed loop forming a ring resonator. Successive pairs of the segments are connected to one another at respective segment ends by successive ones of an equivalent plurality of total internal reflection (TIR) mirrors. The method of optical resonance further comprises reflecting a portion of the optical signal at a TIR mirror of the equivalent plurality. The method further comprises influencing the optical signal within an intracavity active element that overlies a designated segment of the plurality of segments. The method further comprises transmitting a portion of the optical signal out of the ring resonator through a photo-tunneling input/output (I/O) port. The photo-tunneling I/O port comprises a designated one of the TIR mirrors of the equivalent plurality.

Certain embodiments of the present invention have other features that are one or both of in addition to and in lieu of the features described hereinabove. These and other features of the invention are detailed below with reference to the following drawings.

BRIEF DESCRIPTION OF THE DRAWINGS

The various features of embodiments of the present invention may be more readily understood with reference to the following detailed description taken in conjunction with the accompanying drawings, where like reference numerals designate like structural elements, and in which:

FIG. 1A illustrates a cross sectional view of an exemplary conventional slab optical waveguide known as a ridge-loaded optical waveguide.

FIG. 1B illustrates a cross sectional view of another exemplary conventional slab optical waveguide known as a reverse ridge-loaded waveguide.

FIG. 1C illustrates a cross sectional view of an exemplary conventional strip optical waveguide.

DETAILED DESCRIPTION

Figure 2:
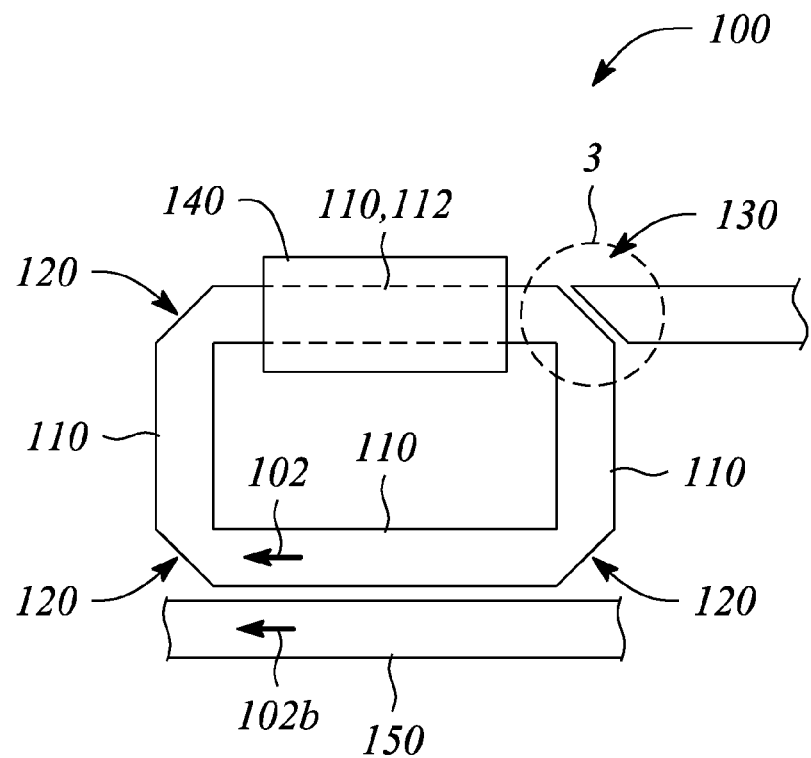
FIG. 2 illustrates a top view of an optical resonator according to an embodiment of the present invention.

Embodiments of the present invention employ optical waveguide segments and total internal reflection (TIR) mirrors to realize an optical resonator having low optical loss. In particular, the optical resonator of the present invention is a closed loop, ring-shaped resonant structure that supports a propagating optical signal within the closed loop. In various embodiments of the optical resonator according to the present invention, one or more input/output ports (I/O ports) are provided. The I/O port(s) facilitate one or both of introducing to and extracting from the optical resonator the propagating optical signal or a portion thereof.

Further, the optical resonator provides active optical properties. In particular, an intracavity active element that is integrated with and optically coupled to the optical resonator. Through the optical coupling, the intracavity active element influences (e.g., generates, amplifies or modulates) an optical signal propagating within the optical resonator. The intracavity active element overlies one or more of the optical waveguide segments, according to various embodiments. The intracavity active element is also referred to herein as an active optical element.

The optical resonator with the intracavity active element of the present invention has a relatively compact and space-efficient form factor, according to various embodiments herein. Moreover, the optical resonator with the intracavity active element is readily fabricated in an integrated circuit (IC) form as part of a larger IC circuit or subsystem. For example, the optical resonator with the intracavity active element is well-suited to fabrication on or in a substrate such as, but not limited to, a multilayer semiconductor substrate. Fabrication on or in the substrate facilitates integrating the optical resonator with other photonic components including, but not limited to, one or more of passive photonic components and active photonic components.

In some embodiments, the optical resonator may be fabricated directly in a surface layer (e.g., thin film layer) of a semiconductor substrate. Further, the intracavity active element may be fabricated as a layer affixed to a top surface of the surface layer, according to various embodiments. For example, the optical resonator may be fabricated in a thin film semiconductor layer of a semiconductor-on-insulator (SOI) substrate (e.g., a silicon or polysilicon thin film layer of a silicon-on-insulator substrate). The intracavity active element may be fabricated using another semiconductor layer that is wafer bonded or otherwise affixed to the top surface of the SOI substrate, for example. Through wafer bonding, the wafer-bonded semiconductor layer may comprise a semiconductor material that differs from, and that even has a lattice that is dissimilar to, the semiconductor material of the surface layer of the semiconductor substrate. For example, the semiconductor material of the surface layer may be silicon while the wafer-bonded semiconductor layer may be a III-V compound semiconductor (e.g., GaAs, AlGaAs, InP, InGaAs, or InGaAsP) or even a II-VI compound semiconductor. Silicon and III-V or II-VI compound semiconductors have dissimilar or mismatched lattices.

In various embodiments, the intracavity active element may be either a saturable active element or an unsaturable active element and function as one or more of an optical source/amplifier and an optical modulator. The term 'optical' as used in 'optical' source/amplifier and 'optical' modulator herein generally refer to one or both of a device and a structure that operates directly on an optical signal without prior conversion of the optical signal into an electrical signal. For example, the optical source/amplifier may be a saturable active semiconductor device that directly generates and/or amplifies an optical signal through stimulated emission within the semiconductor device (e.g., a laser without mirrors). Such devices are sometimes referred to as semiconductor optical amplifiers (SOAs). The optical modulator may be an electro-absorption modulator (EAM), for example.

Similarly, other photonic components other than the intracavity active element may be fabricated on or in the same semiconductor substrate, according to some embodiments. Alternatively, the other photonic components may be fabricated in or on the wafer bonded semiconductor layer of the intracavity active element. Such photonic components include, but are not limited to, optical signal transmission structures (e.g., other optical waveguides), optical switches and optical detectors.

According to some embodiments, the optical resonator employs a slab optical waveguide. In some embodiments, the slab optical waveguide comprises a ridge-loaded optical waveguide. According to other embodiments, the slab optical waveguide comprises an inverted or reverse ridge-loaded optical waveguide. In yet other embodiments, other optical waveguides besides a slab optical waveguide is employed. Such 'non-slab' type optical waveguides may include, but are not limited to, a strip optical waveguide.

As used herein, 'slab optical waveguide' refers to an optical waveguide in which the propagating optical signal is confined to and propagates within a slab or sheet of dielectric material. As such, the slab optical waveguide is a member of the class of dielectric waveguides. The slab optical waveguide is also referred to as simply a 'slab waveguide' herein.

In some embodiments, a thickness of the slab waveguide is selected to preferentially sustain a lower order propagating mode of the optical signal. For example, the thickness may be less than a particular thickness such that only a first transverse electric mode (i.e., $TE_{10}$) can propagate. The particular thickness depends on a refractive index of a material of the slab waveguide as well as specific physical characteristics of the slab waveguide (i.e., optical waveguide type). Design guidelines and equations are readily available for establishing the particular thickness for a given refractive index and optical waveguide type.

FIG. 1A illustrates a cross sectional view of an exemplary conventional slab optical waveguide known as a ridge-loaded optical waveguide 10. The ridge-loaded optical waveguide 10 is also sometimes referred to as a 'ridge-loaded waveguide' or simply a 'ridge waveguide'. The ridge-loaded waveguide comprises a slab layer 12. In some embodiments, the slab layer 12 may comprise a thin film layer deposited on an underlying layer or an underlying supporting substrate (not illustrated). In such embodiments, the ridge-loaded waveguide 10 may be termed a 'thin film' ridge-loaded waveguide 10.

The slab layer 12 comprises a dielectric material through which an optical signal propagates and is guided within the ridge-loaded waveguide 10. In particular, essentially all of the energy of the optical signal is confined to the slab layer 12. In general, the slab layer 12 comprises a dielectric material or a semiconductor material, which behaves essentially as a dielectric material with respect to its use in an optical waveguide. Moreover, the material of the slab layer 12 is essentially transparent to the optical signal.

For example, the slab layer 12 may comprise a semiconductor material that is compatible with the optical signal such as, but not limited to, silicon (Si), gallium arsenide (GaAs), and lithium niobate ($LiNbO_3$). Dielectric materials used for the slab layer 12 may include, but are not limited to, glass (e.g., borosilicate glass) and various polymers (e.g., polycarbonate). Any of a single crystalline, polycrystalline or amorphous layer of the dielectric material or the semiconductor material may be employed, according to various embodiments. The transparency of the slab layer material affects an optical loss of the ridge-loaded waveguide. For example, the less transparent the material, the more loss is experienced by the optical signal.

In some embodiments, the slab layer 12 is supported by a support layer 14. The support layer 14 physically supports the slab layer 12. In some embodiments, the support layer 14 also facilitates optical confinement in the slab layer 12. In some embodiments, the support layer 14 may comprise a material that differs from the material of the slab layer 12. In particular, the support layer 14 may comprise a material having a refractive index that is different from a refractive index of the slab layer 12. For example, the support layer 14 may be an oxide-based insulator layer (e.g., silicon oxide). In another example, the support layer 14 is an insulator layer of an SOI substrate. In some embodiments, the different refractive index of the support layer 14 serves to essentially confine the optical signal to the slab layer 12.

The ridge-loaded waveguide 10 further comprises a ridge 16. The ridge 16 is located on and extends above a top surface of the slab layer 12. The ridge 16 serves to 'guide' the optical signal within the slab layer 12. In particular, essentially all of the optical energy of the optical signal is concentrated below but adjacent to the ridge 16 within the slab layer 12. For example, the optical signal may be essentially concentrated in a roughly circular region below the ridge 16, as illustrated by an exemplary dashed circle in FIG. 1A.

The ridge 16 may be formed by one or more of an etching process, a selective deposition process, or a printing process, for example. A particular width and height of the ridge 16 are generally a function of a refractive index of the slab layer 12 material. Information for determining the width and the height may be readily obtained from conventional design guidelines and using computer design models for ridge-loaded optical waveguides.

FIG. 1B illustrates a cross sectional view of another exemplary conventional slab waveguide known as a reverse ridge-loaded optical waveguide 20. The reverse ridge-loaded optical waveguide 20 is also referred to simply as a 'reverse ridge-loaded waveguide' or a 'reverse ridge waveguide' herein.

The reverse ridge-loaded waveguide 20 comprises a slab layer 22. The reverse ridge-loaded waveguide 20 further comprises a support layer 24. The support layer 24 comprises a material having a refractive index that differs from a refractive index of the slab layer 22. The slab layer 22 is essentially similar to the slab layer 12 of the ridge-loaded waveguide 10 described above, according to some embodiments. Further, the support layer 24 may be essentially similar to the support layer 14 of the ridge-loaded waveguide 10 described above, according to some embodiments. In some embodiments, the slab layer 22 comprises a thin film layer deposited on the support layer 24, wherein the support layer 24 is lying on a supporting substrate (not illustrated). In such embodiments, the reverse ridge-loaded waveguide 20 may be termed a 'thin film' reverse ridge-loaded waveguide 20.

The reverse ridge-loaded waveguide 20 further comprises a ridge 26. The ridge 26 extends from an interface between the support layer 24 and the slab layer 22 down and into the support layer 24. As with the ridge 16 of the ridge-loaded waveguide 10 described above, the ridge 26 of the reverse ridge-loaded waveguide 20 serves to guide the optical signal within the slab layer 22. An exemplary dashed circle above but adjacent to the ridge 26 illustrates an approximate extent of the optical signal energy associated with the optical signal propagating in the reverse ridge-loaded waveguide 20, by way of example.

FIG. 1C illustrates a cross sectional view of an exemplary conventional strip optical waveguide 30. The strip optical waveguide 30, or simply 'strip waveguide', comprises a strip layer 32 and a support layer 34. The strip optical waveguide 30 further comprises a strip 36 formed in or from the strip layer 32. In particular, the strip 36 may be formed in the strip layer 32 by etching channels 38 to define the strip 36, as illustrated in FIG. 1C. The channels 38 optically isolate the strip 36 from the strip layer 32. In other embodiments, the strip 36 comprises the entire strip layer 32 (not illustrated). For example, the strip layer 32 may be essentially removed by etching to leave only the strip 36 during fabrication. As such, channels are not formed.

In contrast to the slab waveguides 10, 20, the optical energy within the strip waveguide 30 is essentially confined to the strip 36 by the presence of sidewalls 39 of the strip 36. A material boundary exists at the sidewalls 39 between a material of the strip layer 32 and air or another dielectric material within the channels 38. The boundary represents a change in a refractive index across the boundary. The refractive index change causes an optical signal to be tightly bound to the strip 36 due to total internal reflection therewithin. A dashed circle within the strip 36 illustrates an approximate extent of the optical energy associated with the optical signal propagating in the strip waveguide 30, for example.

The optical resonator according to some embodiments of the present invention may be referred to as a 'folded cavity' resonator because mirrors are employed along an optical path within the optical resonator. In particular, mirrors are employed to introduce an abrupt change in a direction of the propagating signal within the optical resonator. In other words, an optical path within the resonator is effectively 'folded' by a presence of the mirror. Essentially, the mirrors compensate for weak guiding interaction of the optical waveguides that make up the optical resonator. As such, the mirrors allow the optical resonator to be realized in a more compact and space efficient shape than would be possible otherwise. Total internal reflection mirrors are employed to realize the folded cavity of the optical resonator, according to some embodiments.

A total internal reflection mirror (TIR mirror) is defined as a mirror that reflects or changes a direction of an optical signal using total internal reflection. Total internal reflection is a well-known optical phenomenon. Total internal reflection of an optical signal traveling in a material occurs when the optical signal encounters a material boundary at an angle greater than a critical angle relative to a normal of the boundary. In particular, when the material boundary represents a change in refractive index from a higher refractive index to a lower refractive index, the optical signal will be essentially unable to penetrate the boundary and will be reflected back away from the boundary. The reflection obeys the law of reflection in that a reflection angle equals an angle of incidence on the boundary. An example of a boundary that may provide total internal reflection and thus, be employed as a TIR mirror is a boundary between a dielectric material (e.g., glass or silicon) and air.

The optical resonator according to some embodiments herein employs a photo-tunneling input/output (I/O) port to one or both of introduce optical signals into and extract (i.e., couple) optical signals from the optical resonator. As used herein, a 'photo-tunneling I/O port' is a junction between optical waveguide segments that transmit a propagating signal through a photo-tunneling junction. A photo-tunneling junction is a junction that employs a non-propagating or evanescent optical mode to transmit optical energy across the junction.

For example, a gap or channel may be introduced in an optical waveguide that separates the waveguide into two segments. The gap may comprise an air gap or channel that physically separates the two waveguide segments. The gap, having a different (e.g., lower) refractive index than the refractive index of a material of the waveguide segments, effectively causes a reflection of an optical signal incident on the gap. In particular, the presence of the gap interrupts propagation of the optical signal along the optical waveguide. However, if the gap has an extent that is generally less than, and typically much less than, a wavelength of the optical signal, a non-propagating mode or evanescent field of the optical signal may essentially jump or 'tunnel' across the gap. The tunneling enables the optical signal to propagate from a first segment of the optical waveguide on one side of the gap to a second segment of the optical waveguide on the other side. Moreover, by controlling a width of the gap or a distance between the two optical waveguide segments, an amount of the optical signal that tunnels across the photo-tunneling junction may be controlled or adjusted.

According to some embodiments of the present invention, the photo-tunneling I/O port comprises a TIR mirror, a gap and a segment of an optical waveguide segment. The gap separates the TIR mirror from an end of the optical waveguide. In other embodiments, the photo-tunneling I/O port comprises a TIR mirror, a gap and another TIR mirror. The gap is generally less than one wavelength of the optical signal incident on the gap. In some embodiments, the gap is approximately one to ten percent (i.e., 1-10%) of the wavelength of the optical signal. Such an arrangement of a TIR mirror, gap and either a segment of optical waveguide or another TIR mirror is also known as a 'frustrated TIR mirror'.

In some embodiments, the optical resonator or a portion thereof may provide asymmetric propagation of the optical signal. In particular, the asymmetric propagation may be relative to a direction of optical signal propagation around a loop of the optical resonator (e.g., clockwise or counter clockwise). In some of such embodiments, asymmetric propagation is provided by a magneto-optical effect.

For example, the optical waveguide of the optical resonator may be selectively doped with a magnetic material. Selective doping may comprise either doping only a portion of one or more of the optical waveguide segments of the optical resonator, doping one or more optical waveguide segments in their entirety, or doping the entire optical resonator, in various embodiments. In another example the magnetic material providing the magneto-optical effect is confined to a layer or layers associated with the optical resonator. For example, a layer comprising magnetic material may be provided underneath and separated from the optical waveguide by less than about a wavelength such that an optical mode propagating in the waveguide couples (e.g., evanescently) into the magnetic material layer. Using a separate layer(s) for the magnetic material may reduce a detrimental effect of the magnetic material, for example. In various embodiments, the magnetic material layer may be either uniformly distributed across the optical resonator or confined to only a portion thereof. For example, the magnetic material layer may be confined to a single waveguide segment of a rectangular-shaped optical resonator.

An externally applied magnetic field may be employed to bias the magnetic material used to dope the optical resonator, according to some embodiments. Magnetic materials comprising one or more of iron (Fe), magnesium (Mg), manganese (Mn), nickel (Ni), cobalt (Co), and various alloys and compounds thereof may be employed. In various embodiments, the use of the magnetic material in conjunction with the optical resonator essentially produces an asymmetric refractive index of the optical waveguide. The asymmetric refractive index essentially provides or facilitates the asymmetric propagation.

For simplicity herein, no distinction is made between a substrate and any layer or structure on the substrate unless such a distinction is necessary for proper understanding. Also for simplicity herein, the term 'gain' is defined to include one or both of positive gain (e.g., an increase in signal level) and negative gain (e.g., attenuation). Additionally, all waveguides described herein are optical waveguides so that omission of the term 'optical' when referring to a 'waveguide' does not change the intended meaning of the embodiment being described. Further, as used herein, the article 'a' is intended to have its ordinary meaning in the patent arts, namely 'one or more'. For example, 'a segment' means one or more segments and as such, 'the segment' means 'the segments(s)' herein. Also, any reference herein to 'top', 'bottom', 'upper', 'lower', 'up', 'down', 'left' or 'right' is not intended to be a limitation herein. Moreover, examples herein are intended to be illustrative only and are presented for discussion purposes and not by way of limitation. U.S. patent application of Wu et al., entitled, "Optical Waveguide Ring Resonator with Photo-Tunneling Input/Output Port", filed concurrently herewith, is incorporated by reference herein in its entirety.

FIG. 2 illustrates a top view of an optical resonator 100 according to an embodiment of the present invention. An optical signal 102 is illustrated, by way of example, propagating in a clockwise direction around a closed path of the optical resonator 100. While illustrated as propagating in an exemplary clockwise direction, the optical signal 102 may propagate equally well in a counter clockwise direction and is within the scope of the embodiments described herein.

The optical resonator 100 comprises a plurality of segments 110 of an optical waveguide (i.e., optical waveguide segments 110). The optical waveguide segments 110 are arranged as a closed loop. Each of the optical waveguide segments 110 guides the optical signal 102 along a length of the segment 110. Specifically, the optical signal 102 propagates along each of the segments 110 from an arbitrary starting point and eventually returns to the starting point. As such, when introduced into the optical resonator 100, the optical signal 102 repeatedly retraces or cycles around the closed loop and thus resonates within the optical resonator 100. A resonance frequency of the optical resonator 100 is an inverse of a transit time of the propagating optical signal 102 around to the closed loop.

In some embodiments, the optical waveguide segments 110 of the plurality comprise substantially straight or linear segments of an optical waveguide. The substantially linear optical waveguide segments 110 are arranged as sides of a closed polygon. The polygon is a simple polygon that is either a convex polygon or a concave polygon, according to various embodiments. The optical resonator 100 embodiment illustrated in FIG. 2 comprises four optical waveguide segments 110 that are arranged as four sides of a rectangle representing the closed loop, by way of example. In other embodiments, the closed loop formed by the optical waveguide segments 110 may be represented by essentially any closed polygon having more than two sides including, but not limited to, a triangle, a pentagon, and a hexagon.

The optical resonator 100 further comprises an equivalent plurality of total internal reflection (TIR) mirrors 120. The term 'equivalent plurality' herein is defined to mean that a number or quantity of TIR mirrors 120 in the mirror plurality is equivalent to or the same as a number or quantity of optical waveguide segments 110 in the segment plurality. The TIR mirrors 120 connect pairs of optical waveguide segments 110 to one another to form the closed loop. In particular, each TIR mirror 120 connects together adjacent ends of a respective pair of optical waveguide segments 110 to successively close the loop. Further, the TIR mirrors 120 facilitate propagation of the optical signal 102 within the optical resonator 100. When the optical signal 102 propagating along a particular optical waveguide segment 110 encounters a TIR mirror 120 at the end of the particular segment 110, the TIR mirror 120 redirects or reflects the optical signal 102 such that the optical signal 102 enters an adjacent or successive optical waveguide segment 110.

The optical resonator 100 further comprises a photo-tunneling input/output (I/O) port 130. When functioning as an input port, the photo-tunneling I/O port 130 admits or introduces the optical signal 102, or a portion thereof, into the optical resonator 100. When functioning as an output port, the photo-tunneling I/O port 130 allows the optical signal 102, or a portion thereof, to exit from or leave the optical resonator 100.

In general, whether the photo-tunneling I/O port 130 functions as an input port or an output port depends on a direction of propagation of the optical signal 102. That is, when the optical signal 102 is inside the optical resonator 100 and encounters the photo-tunneling I/O port 130, the port 130 functions as an output port and transmits the optical signal 102, or a portion thereof, out of the optical resonator 100. Alternatively, the photo-tunneling I/O port 130 functions as an input port if the optical signal 102 is incident on the port 130 from outside the optical resonator 100. In either instance, a portion of the optical signal 102 passes through the photo-tunneling I/O port 130 by a photo-tunneling effect (e.g., evanescent field coupling across a gap) associated with the port 130, as described above. In FIG. 2, the photo-tunneling I/O port 130 is illustrated as an output port.

Figure 3:
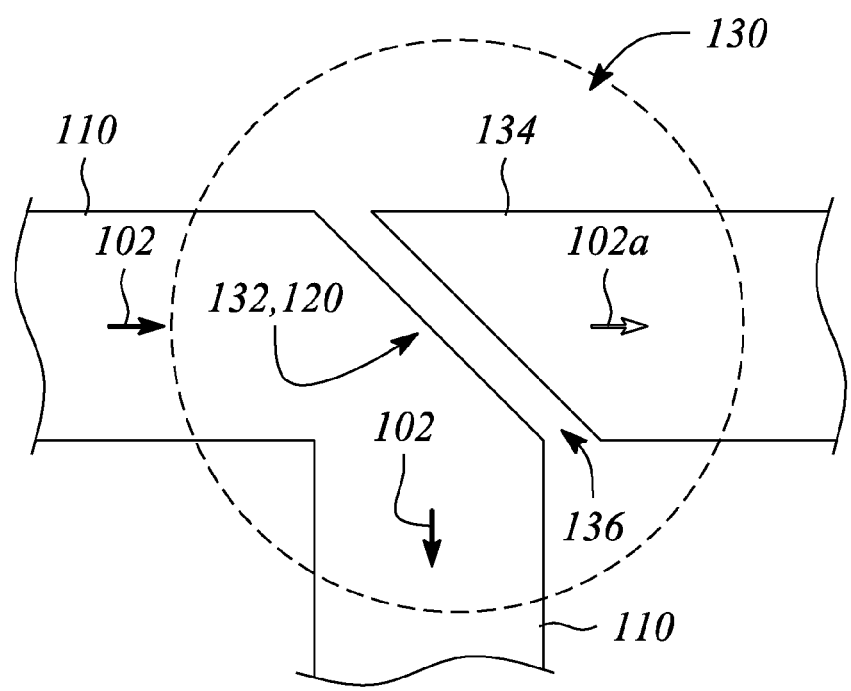
FIG. 3 illustrates a magnified view of a photo-tunneling I/O port portion of the optical resonator illustrated in FIG. 2, according to an embodiment of the present invention.

FIG. 3 illustrates a magnified view of the photo-tunneling I/O port 130 illustrated in FIG. 2, according to an embodiment of the present invention. The photo-tunneling I/O port 130 comprises a designated TIR mirror 132 of the plurality of TIR mirrors 120. The photo-tunneling I/O port 130 further comprises a segment 134 of an optical waveguide having an end. The designated TIR mirror 132 is a selected one of the TIR mirrors 120 adjacent to the end of the segment 134 of optical waveguide. The optical waveguide segment 134 is separate and apart from the plurality of optical waveguide segments 110 of the optical resonator 100. The photo-tunneling I/O port 130 further comprises a gap 136 that separates the end of the optical waveguide segment 134 from the designated TIR mirror 132. Also illustrated in FIG. 3 is a portion 102a of the optical signal 102 that passes through the photo-tunneling I/O port 130 and into the segment 134.

In some embodiments, the gap 136 is filled with a material. In general, the gap material may comprise either a fluid (e.g., a gas or a liquid) or a solid (e.g., a semiconductor material or a dielectric material), in some embodiments. In other embodiments, the gap 136 is essentially devoid of a gap material (e.g., a vacuum). In either case, the gap 136 has a refractive index that differs from and in some embodiments, is lower than a refractive index of respective materials of the designated TIR mirror 132 and the optical waveguide segment 134. For example, the gap material may be a gas (e.g., air) of an environment surrounding the optical resonator 100. Air has a refractive index of about one. The respective materials of the designated TIR mirror 132 and the optical waveguide segment 134 may have refractive indices of about four, for example. Specifically, the refractive indices of the designated TIR mirror 132 material and the optical waveguide segment 134 material is different from the refractive index of the gap material.

In some embodiments, the gap 136 is formed as a slot or channel that separates the designated TIR mirror 132 from the optical waveguide segment 134. In other embodiments, the gap 136 is a region filled with a suitable transmissive material having a refractive index that differs from (i.e., is less than that of) a refractive index of the optical waveguide of the designated TIR mirror 132 and the separate optical waveguide segment 134 (not illustrated).

Referring again to FIG. 2, the optical resonator 100 further comprises an intracavity active element 140. The intracavity active element 140 overlies and is optically coupled with a designated segment 112 of the plurality of segments 110 of an optical waveguide. In some embodiments (not illustrated), more than one designated segment 112 is provided. In such embodiments, the intracavity active element 140 simultaneously overlies and is coupled to each of the designated segments 112. In general, a number of designated segments 112 is less than or equal to the number of optical waveguide segments 110 in the plurality of segments.

According to various embodiments, the intracavity active element 140 comprises an active optical structure or layer. As used herein, an 'active' optical layer is a layer of material that can directly influence an optical signal within the layer in an active (e.g., non-passive) manner. For example, an active optical layer may influence the optical signal 102 through stimulated emission within the layer. The active optical layer influence may be controlled by another optical signal (e.g., optical pumping) or an electrical signal (e.g., electrical pumping) applied to the intracavity active element 140, for example.

The optical signal 102, or a portion thereof, propagating in the designated segment 112 is coupled into the intracavity active element 140. The intracavity active element 140 influences the coupled portion of the optical signal 102. For example, the intracavity active element 140 may be an optical source 140 (e.g., a laser amplifier) that one or both of generates the optical signal 102 that propagates in the designated segment 112 and adds optical energy to (i.e., amplifies) the optical signal 102. The optical source 140 may influence (i.e., generate and/or amplify) the coupled portion of the optical signal 102 through stimulated emission within a gain medium or material of the intracavity active element 140, for example. Stimulated emission may be facilitated by application of an electrical voltage or current to the intracavity active element 140, for example. In another example, the intracavity element 140 may comprise the optical source and further comprise a saturable absorber. In yet another example, the intracavity active element 140 may be an electro-absorption modulator (EAM) 140. The EAM 140 influences the coupled portion of the optical signal to modulate (i.e., vary an amplitude of) the optical signal 102. The modulation may be controlled by an electrical signal applied to the EAM 140, for example.

In some embodiments, another optical port may be employed in addition to the photo-tunneling I/O port 130. Referring again to FIG. 2, another optical port is illustrated as a segment 150 of optical waveguide. The segment 150 is parallel and proximal to one of the optical waveguide segment 110 of the optical resonator 100, as illustrated. This sort of other optical port is often referred to as a 'parallel line' port and may function as either an input port or an output port with respect to the optical resonator 100. For example, a portion of an optical signal 102*b* propagating in the parallel segment 150 of optical waveguide may be coupled into the optical waveguide segment 110. The portion of the optical signal 102*b* coupled into the optical resonator 100 may become the optical signal 102, for example.

Figure 4:
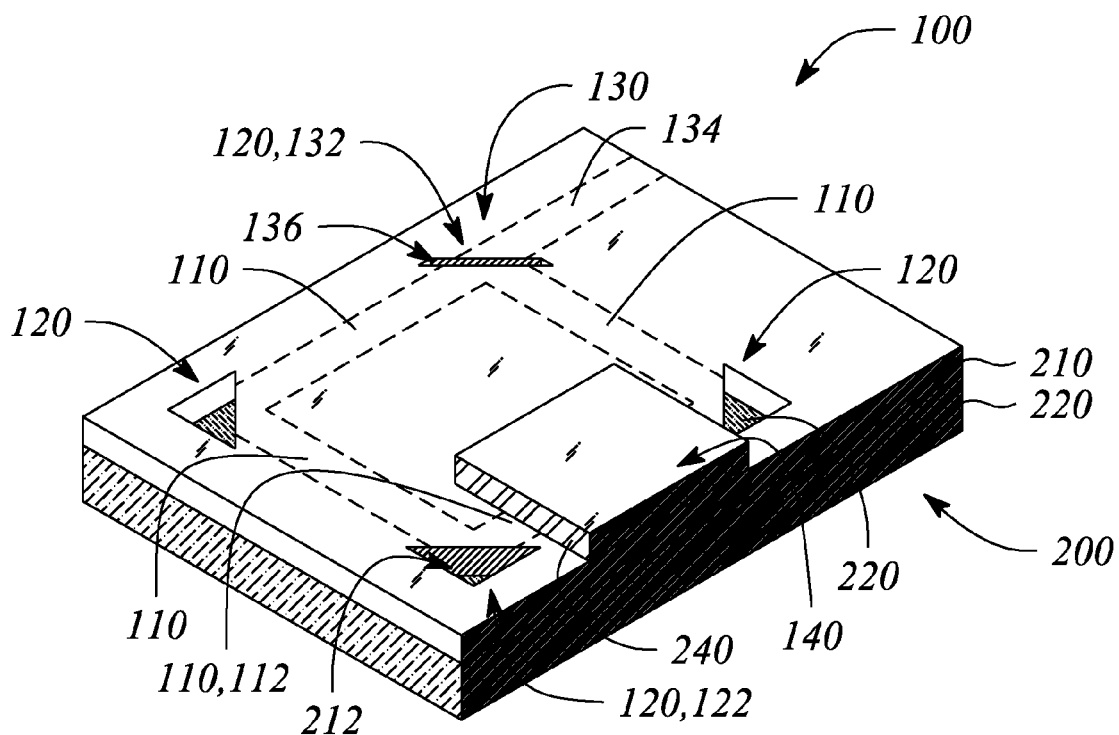
FIG. 4 illustrates a perspective view of the optical resonator of FIG. 2 realized in a surface layer of a substrate, according to an embodiment of the present invention.

FIG. 4 illustrates a perspective view of the optical resonator 100 of FIG. 2 realized in a surface layer of a substrate 200, according to an embodiment of the present invention. In particular, as illustrated in FIG. 4, the substrate 200 comprises a semiconductor on insulator (SOI) substrate 200 having a semiconductor layer 210 situated on top of an oxide-based or similar insulator layer 220. The optical resonator 100 is illustrated within the semiconductor layer 210. The semiconductor layer 210 may be similar to the slab layer 12, 22 described above with respect to FIGS. 1A and 1B, in some embodiments, or the strip layer 32 illustrated in FIG. 1C, in some embodiments. Similarly, the insulator layer 220 may be similar to any of the support layers 14, 24, 34 described above with respect to FIGS. 1A, 1B and 1C, in some embodiments.

Four optical waveguide segments 110 connected by respective ones of four TIR mirrors 120 form the optical resonator 100 embodiment illustrated in FIG. 4, by way of example. Further as illustrated, the optical waveguide segments 110 comprise a reverse ridge-loaded waveguide (e.g., the reverse ridge-loaded waveguide 20 described above). An approximate extent of a guided portion of an optical signal is illustrated in FIG. 4 as a pair of dashed lines on either side of a hypothetical centerline (not illustrated) of the reverse ridge-loaded waveguide segments 110.

As illustrated in FIG. 4, the TIR mirrors 120 are each realized as a hole or cavity 212 formed in a guiding portion (i.e., semiconductor layer 210) of the substrate 200. The cavity 212 creates a TIR wall 122 (e.g., refractive index difference or discontinuity) across an optical propagation axis (i.e., the center line of the optical waveguide) of a pair of intersecting optical waveguide segments 110. The TIR wall 122 generally extends beyond the extent of the guided portion of the optical signal. In some embodiments, the TIR wall 122 extends into a ridge portion of the reverse ridge-loaded waveguide.

The photo-tunneling I/O port 130 is also illustrated in FIG. 4. The photo-tunneling I/O port 130 is realized by a gap 136 formed in the semiconductor layer 210. The gap 136, having a width of less than one wavelength (e.g., 1-10% of a wavelength) of the optical signal, separates the designated TIR mirror 132 from an optical waveguide segment 134 that acts as an output path or connection for the optical signal. The optical resonator 100 may be fabricated in the SOI substrate 200 using conventional semiconductor fabrication methods, for example.

Further illustrated in FIG. 4 is the intracavity active element 140. In particular, the intracavity active element 140 comprises a semiconductor layer 240. The semiconductor layer 240 of the intracavity active element 140 is affixed to a surface of the semiconductor layer 210. For example, the semiconductor layer 240 may be wafer bonded to the surface of the semiconductor layer 210. Moreover, the intracavity active element 140 is located over a designated segment 112 of the reverse ridge-loaded waveguide 110.

Figure 5:
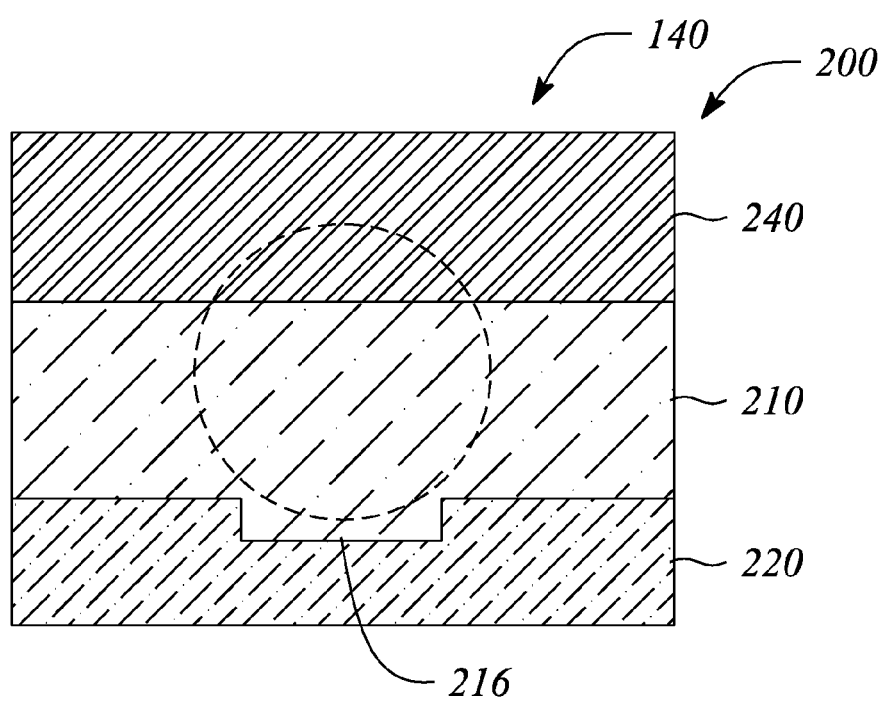
FIG. 5 illustrates a cross sectional view through an intracavity active element of the optical resonator illustrated in FIG. 4, according to an embodiment of the present invention.

FIG. 5 illustrates a cross sectional view through the intracavity active element 140 of the optical resonator 100 illustrated in FIG. 4, according to an embodiment of the present invention. In particular, FIG. 5 illustrates a cross section through the SOI substrate 200 that intersects the designated segment 112.

In some embodiments, the semiconductor layer 240 of the intracavity active element 140 comprises a semiconductor material that is similar to a semiconductor material of the semiconductor layer 210. In other embodiments, the semiconductor material of the semiconductor layer 240 is different from that of the semiconductor layer 210. Further, in some embodiments, the semiconductor layer 240 comprises a semiconductor material having a lattice that is dissimilar or mismatched to that of the semiconductor material of the semiconductor layer 210. For example, the semiconductor layer 210 may comprise silicon while the semiconductor layer 240 may comprise GaAs. In such embodiments, the optical resonator 100 may comprise the semiconductor layer 240 affixed to the surface of the semiconductor layer 210 by wafer bonding.

In some embodiments, the semiconductor layer 240 comprises a compound semiconductor. In some embodiments, the compound semiconductor is either a III-V compound semiconductor or a II-VI compound semiconductor. For example, the semiconductor layer 240 may comprise one or more of GaAs, InP, AlGaAs, InGaAs, InGaAsP, and other direct band gap semiconductor gain materials.

Furthermore, while illustrated by way of example as a single layer, the semiconductor layer 240 may actually comprise one or more layers, according to various embodiments. In addition, while not illustrated, the semiconductor layer 240 may further comprise one or more dopants and dopant concentrations as well as an electrical connection to other components or power sources (e.g., electrical contact pad). The dopants and dopant concentrations and the electrical connection are used to realize a particular type or functionality of the electrical gain element 140, for example.

For example, the intracavity active element 140 may comprise a heterostructure diode junction. Such heterostructures may comprises a plurality of variously doped (e.g., n, n+, p, and p+) layers. In another example, the intracavity active element 140 may comprise a quantum well diode junction often used for solid state (e.g., diode) lasers and optical amplifiers. In yet another example, the intracavity active element 140 may comprise a plurality of variously doped layers arranged as a separate confinement heterostructure laser structure.

The optical signal that is introduced to propagate in the optical resonator 100 has one or more propagating modes. Each propagating mode has a physical size or extent. As used here, the extent of the propagating mode (or equivalently the propagating signal) is a bounded region within which a majority of the optical energy associated with the mode is confined during propagation. In some embodiments, an extent of a lowest order propagating mode of the optical signal is greater than a thickness of a guiding portion of the slab optical waveguide of the designated segment 112. As a result, a portion of the optical signal extends above a top surface of the slab optical waveguide and into the overlying intracavity active element 140. The portion of the optical signal that extends into the intracavity active element 140 is effectively coupled into the intracavity active element 140. Thus, the intracavity active element 140 is able to influence this portion of the optical signal.

As illustrated in FIG. 5, the approximate extent of the optical signal is depicted as a circular dashed line. The circular dashed line extends into the semiconductor layer 240 of the intracavity active element 140. Further, the optical signal extent is generally located above and extending into a ridge 216 associated with the reverse ridge-loaded waveguide. As illustrated in FIG. 5, the ridge 216 comprises the semiconductor material of the semiconductor layer 210 and extends down into the insulator layer 220. As such, a portion of the optical signal is effectively coupled into and propagates within the semiconductor layer 240 of the intracavity active element 140. The portion of the optical signal propagating within the semiconductor layer 240 is available to be influenced by the intracavity active element 140.

Figure 6:
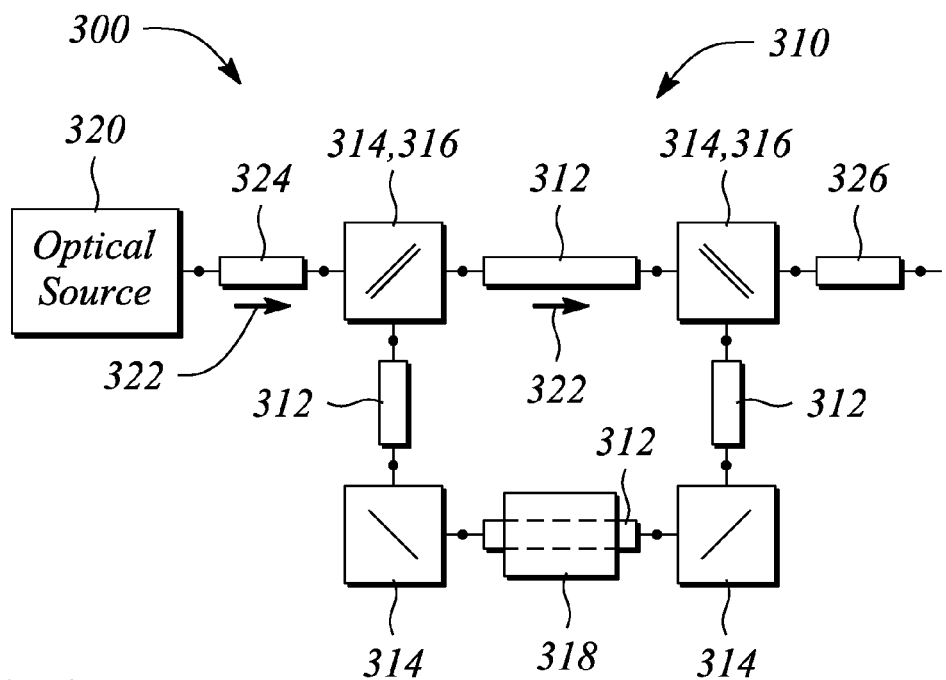
FIG. 6 illustrates a block diagram of a photonic system according to an embodiment of the present invention.

FIG. 6 illustrates a block diagram of a photonic system 300 according to an embodiment of the present invention. The photonic system 300 comprises an optical resonator 310. The optical resonator 310 comprises a plurality of optical waveguide segments 312, an equivalent plurality of TIR mirrors 314 and a photo-tunneling input output (I/O) port 316. The optical resonator 310 further comprises an intracavity active element 318. The intracavity active element 318 is optically coupled to a designated segment 312 of the plurality of segments 312.

The optical waveguide segments 312 are arranged in a closed loop with TIR mirrors 314 interconnecting the segments 312. The photo-tunneling I/O port 316 comprises one of the TIR mirrors 314 of the plurality. In some embodiments, the optical resonator 310 is essentially similar to the optical resonator 100 described above.

In some embodiments, the intracavity active element 318 comprises an optical source/amplifier. In other embodiments, the intracavity active element 318 comprises an optical modulator (e.g., an EAM). In some embodiments, the intracavity active element 318 is essentially similar to the intracavity active element 140 described above with reference to the optical resonator 100.

The photonic system 300 further comprises an optical signal source 320 that generates an optical signal 322. For example, the optical signal source 320 may comprise a laser or a light emitting diode (LED). The generated optical signal 322 is coupled into and resonates within the optical resonator 310. In some embodiments (not illustrated), the optical signal source 320 comprises the intracavity active element 318.

In some embodiments, the optical signal 322 is coupled into the optical resonator 310 via the photo-tunneling I/O port 316. For example, the optical signal source 320 may feed the optical signal 322 into a segment of an optical waveguide 324. In turn, the segment of the optical waveguide 324 has an end that terminates in the photo-tunneling I/O port 316. As such, the I/O port 316 functions as an input port in this example.

In other embodiments, the optical signal 322 may be coupled into the optical resonator 310 via another I/O port. For example, a segment of an optical waveguide (not illustrated) parallel with and in close proximity to one of the optical waveguide segments 312 of the optical resonator 310 may act as the I/O port. In some embodiments, either of the photo-tunneling I/O port 316, another photo-tunneling I/O port 316, or another I/O port (not illustrated) may act as an output port.

For example, the output port may sample a portion of the optical signal 322 resonating within the optical resonator 310. The sampled portion is then coupled to an optical waveguide segment 326, for example. As such, the I/O port 316 functions as an output port in this example. In another example, the sampled portion of the optical signal 322 is coupled to another component (not illustrated) external to the optical resonator 310. In some embodiments, the optical source 320 may be located within the optical resonator 310.

Figure 7:
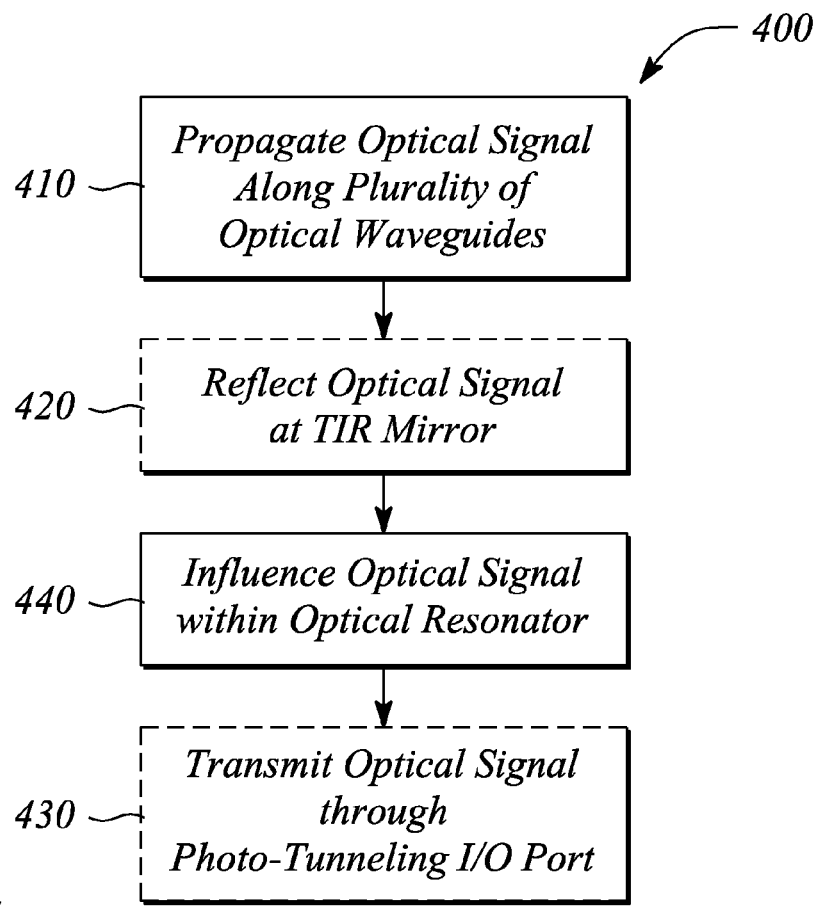
FIG. 7 illustrates a flow chart of a method of optical resonance according to an embodiment of the present invention.

FIG. 7 illustrates a flow chart of a method 400 of optical resonance according to an embodiment of the present invention. The method 400 of optical resonance comprises propagating 410 an optical signal along a plurality of optical waveguide segments. For example, the optical waveguide segments are arranged in a closed loop forming a ring resonator. Successive pairs of the optical waveguide segments are connected to one another at respective adjacent segment ends by corresponding ones of an equivalent plurality of TIR mirrors to further define the closed loop of the ring resonator. In some embodiments, the ring resonator is essentially similar to any of the embodiments described above for the optical resonator 100.

In some embodiments, the method 400 of optical resonance further comprises reflecting 420 the optical signal at a TIR mirror. In some of these embodiments, essentially the entire optical signal is reflected 420 by the TIR mirror. In particular, the optical signal propagating in a first optical waveguide segment of a successive pair is reflected by the TIR mirror connected to the adjacent ends of the first optical waveguide segment and a second optical waveguide segment of the successive pair. After being reflected 420, the optical signal enters and propagates in the second optical waveguide segment of the successive pair. The optical signal ultimately encounters another TIR mirror at an opposite end of the second optical waveguide segment. The other TIR mirror further reflects 420 the optical signal in a similar fashion into a respective successive optical waveguide segment. By successively propagating 410 and reflecting 420, the optical signal may traverse around or circumnavigate the closed loop of the ring resonator. In other of these embodiments, only a portion of the optical signal is reflected 420. A dashed-line box in FIG. 7 is employed to indicate that reflecting 420 is optional, in some embodiments.

The method 400 of optical resonance further comprises influencing 440 the optical signal within an intracavity active element that overlies a designated segment of the plurality of optical waveguide segments. Influencing 440 the optical signal may comprise one or more of amplifying the optical signal, modulating the optical signal, and generating the optical signal, according to various embodiments.

In particular, in some embodiments, influencing 440 the optical signal comprises coupling a portion of the optical signal from the designated optical waveguide segment into an overlying intracavity active element. In various embodiments, influencing 440 further comprises one or more of amplifying, modulating, and attenuating the coupled portion of the optical signal within the intracavity active element. Influencing 440 further comprises subsequently coupling the coupled portion of the optical signal, which is one or more of amplified, modulated, and attenuated, back into the designated optical waveguide segment. In some embodiments, the portion of the optical signal that is influenced 440 by the intracavity active element is a portion of a propagating mode of the optical signal that extends into the overlying intracavity active element.

In some embodiments, the method 400 further comprises transmitting 430 the optical signal through a photo-tunneling input/output (I/O) port. Only a portion of the optical signal is transmitted 430 through the photo-tunneling I/O port, according to some embodiments. Transmitting 430 includes within its scope one or both of transmitting out of the ring resonator and transmitting into the ring resonator. In some of these embodiments, the transmitted 430 optical signal, or the portion thereof, exits out of or leaves the ring resonator. In transmitting 430 the optical signal out of the ring resonator, the photo-tunneling I/O port is acting as an output port, as defined herein.

The photo-tunneling I/O port comprises a designated one of the TIR mirrors of the ring resonator. The photo-tunneling I/O port further comprises a gap and according to some embodiments, another optical waveguide segment that is not part of the plurality of optical waveguide segments of the ring resonator. The designated TIR mirror of the photo-tunneling I/O port generally does not reflect essentially the entire optical signal due to the aforementioned photo-tunneling effect associated with the photo-tunneling I/O port. Instead, only a portion of the optical signal is reflected 420 by the designated TIR mirror at the photo-tunneling I/O port, while the rest of the optical signal is transmitted 430 out of the ring resonator across the gap and into the optional other optical waveguide segment.

In some embodiments, an optical signal from outside of the ring resonator may be transmitted 430 through the photo-tunneling I/O port and into the ring resonator. Thus, in some embodiments, the photo-tunneling I/O port may act as an input port when the source of the optical signal is outside the ring resonator. In some embodiments, the photo-tunneling I/O port may act either as an input port, an output port, or a combination thereof. In some embodiments, there may be more than one photo-tunneling I/O port, in which case whether or not a particular one of the photo-tunneling I/O ports acts as the output port to transmit 430 the optical signal out of the ring resonator generally depends on a specific configuration of the ring resonator (e.g., location of a source of the optical signal). A dashed-line box in FIG. 7 is employed to indicate that transmitting 420 is optional, in some embodiments.

Figure 8A:
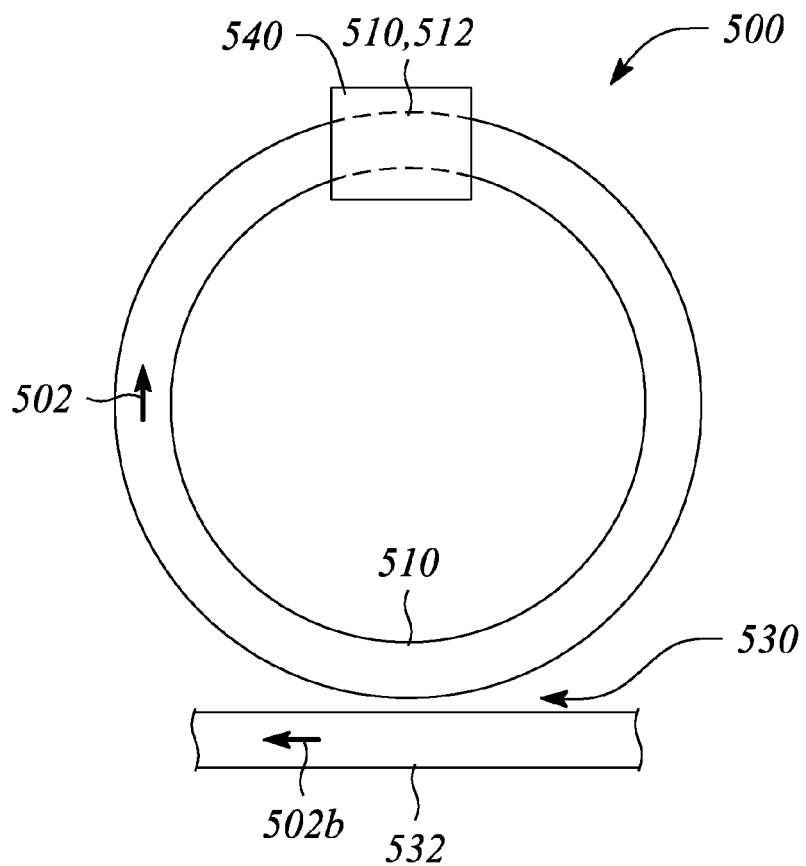
FIG. 8A illustrates a top view of another optical resonator according to an embodiment of the present invention.
Figure 8B:
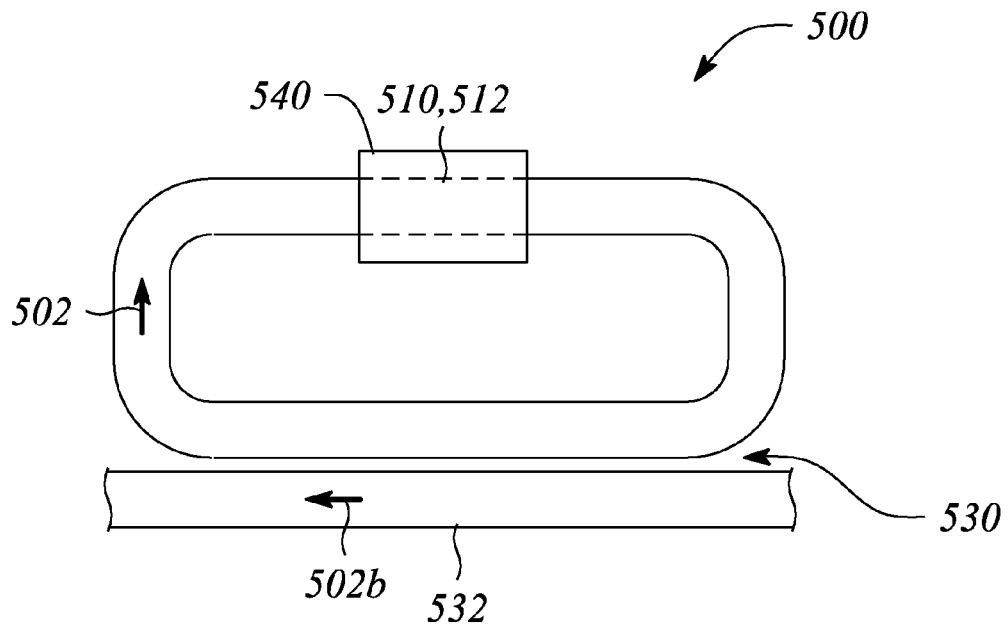
FIG. 8B illustrates a top view of yet another optical resonator according to an embodiment of the present invention.

FIG. 8A illustrates a top view of another optical resonator 500 according to an embodiment of the present invention. Specifically, as illustrated in FIG. 8A the optical resonator 500 comprises a segment of optical waveguide 510 arranged as a circular loop or ring. FIG. 8B illustrates a top view of yet another optical resonator 500 according to an embodiment of the present invention. As illustrated in FIG. 8B, the segment of optical waveguide 510 is arranged as an oval or 'race track' shaped ring.

In some embodiments, the segment of optical waveguide 510 is essentially similar to one of the segments of optical waveguide 110 described above with respect to the optical resonator 100 except that the segment 510 is curved to form a loop instead of being a linear segment (side) of a polygon. An optical signal 502 propagates around the segment of optical waveguide 510 to resonate within the optical resonator 500.

In particular, in some embodiments, the segment of optical waveguide 510 comprises a segment of reverse ridge-loaded slab optical waveguide. The reverse ridge-loaded slab optical waveguide may comprise a layer of a first semiconductor material adjacent to a surface of a substrate (not illustrated). The reverse ridge-loaded slab optical waveguide segment 510 may be essentially similar to the reverse ridge-loaded slab optical waveguide 20 described above. A length of the segment of optical waveguide 510 establishes a resonant frequency of the optical resonator 500.

The optical resonator 500 further comprises an I/O port 530. As illustrated, the I/O port comprises a tangential segment of optical waveguide 532 separated from the optical waveguide segment 510 by a gap. In other embodiments (not illustrated), the I/O port 530 may comprise a photo-tunneling I/O port. An optical signal 502b may be coupled into the optical resonator 500 to become the optical signal 502 when the I/O port 530 is serving as an input port. Alternatively, the I/O port 530 may act as an output port that couples the optical signal 502 out of the optical resonator 500. In some embodiments, the I/O port 530 may be essentially similar to either the photo-tunneling I/O port 130 or the other I/O port (e.g., parallel line port 150) described above with respect to the optical resonator 100.

The optical resonator 500 further comprises an intracavity active element 540. The intracavity active element 540 overlies and is optically coupled with a portion 512 of the segment of optical waveguide 510. The intracavity active element 540 influences the optical signal 502 passing through the portion 512 of the optical waveguide segment 510. The intracavity active element 540 comprises an active optical structure or layer. In various embodiments, the intracavity active element 540 may serve as one or more of an optical modulator, a saturable absorber and an optical source/amplifier to influence the optical signal 502. In some embodiments, the intracavity active element 540 is essentially similar to the intracavity active element 140 described above with respect to the optical resonator 100.

Thus, there have been described embodiments of an optical resonator that employs an intracavity active element, a photonic system employing the optical resonator, and a method of optical resonance employing optical gain. It should be understood that the above-described embodiments are merely illustrative of some of the many specific embodiments that represent the principles of the present invention. Clearly, those skilled in the art can readily devise numerous other arrangements without departing from the scope of the present invention as defined by the following claims.

What is claimed is:

1. An optical resonator comprising:

a plurality of segments of an optical waveguide;

an intracavity active element, the intracavity active element overlying and being optically coupled to a designated segment of the plurality of segments;

a plurality of total internal reflection (TIR) mirrors, a number of TIR mirrors in the plurality of TIR mirrors being equal to a number of segments in the plurality of segments; and a photo-tunneling input/output (I/O) port that comprises a designated TIR mirror of the plurality of TIR mirrors, wherein the plurality of segments of the optical waveguide is arranged as a closed loop wherein successive pairs of the segments are connected to one another at respective segment ends by successive ones of the TIR mirrors.

2. The optical resonator of claim 1, wherein the optical waveguide is a slab optical waveguide on a substrate, and wherein the intracavity active element comprises a semiconductor layer, the semiconductor layer being bonded to a surface of the substrate overlying a portion of the designated segment.

3. The optical resonator of claim 1, wherein the designated segment of the optical waveguide comprises a layer of a first semiconductor material, and wherein the intracavity active element comprises a layer of a second semiconductor material, the second semiconductor material being different from the first semiconductor material.

4. The optical resonator of claim 3, wherein the first semiconductor material comprises silicon and the second semiconductor material comprises a III-V compound semiconductor, the second semiconductor layer being wafer bonded to the first semiconductor layer such that a portion of the second semiconductor layer overlies a portion of the designated segment.

5. The optical resonator of claim 1, wherein the designated optical waveguide segment comprises a reverse ridge-loaded slab optical waveguide within a substrate adjacent to a surface of the substrate, and wherein the intracavity active element comprises a semiconductor layer affixed to the surface of the substrate that overlies a portion of the reverse ridge-loaded slab optical waveguide.

6. The optical resonator of claim 5, wherein the substrate is a silicon-on-insulator (SOI) substrate, the reverse ridge-loaded slab optical waveguide comprising a ridge that extends from a silicon layer of the SOI substrate into an insulator layer of the SOI substrate, and wherein the semiconductor layer of the intracavity active element comprises a compound semiconductor wafer bonded to a surface of the silicon layer of the SOI substrate.

7. The optical resonator of claim 5, wherein a thickness of the designated segment of the optical waveguide is less than an extent of a propagating mode of an optical signal propagating within the designated segment such that a portion of the propagating mode travels within the semiconductor layer of the intracavity active element.

8. The optical resonator of claim 1, wherein the intracavity active element comprises one or both of an optical amplifier and an optical modulator.

9. The optical resonator of claim 1, wherein the plurality of segments of an optical waveguide comprises linear segments, the segments being arranged as sides of a polygon, and wherein the TIR mirrors are vertices of the polygon.

10. The optical resonator of claim 1, further comprising a semiconductor on insulator (SOI) substrate, wherein at least the designated segment of the optical waveguide comprises a thin film reverse ridge-loaded optical waveguide within a semiconductor layer of the SOI substrate adjacent to a surface of the semiconductor layer, the reverse ridge-loaded optical waveguide comprising a ridge of the semiconductor layer that extends into an insulator layer of the SOI substrate, and wherein the intracavity active element comprises a semiconductor layer affixed to the surface of the semiconductor layer such that a portion of a optical signal traveling within the thin film reverse ridge-loaded optical waveguide is coupled into the semiconductor layer of the intracavity active element.

11. The optical resonator of claim 1 used in a system, the system comprising:
the optical resonator; and
an optical signal source,
wherein an optical signal from the optical signal source one or both of enters and exits the optical resonator through the photo-tunneling I/O port, and wherein the optical signal is influenced by the intracavity active element while the optical signal is propagating within the optical resonator.

12. The optical resonator of claim 11 used in the system, wherein the optical signal source comprises the intracavity active element.

13. A photonic system comprising:
an optical source that produces an optical signal; and
an optical resonator that receives the optical signal, the optical resonator comprising:
a plurality of segments of an optical waveguide;
an intracavity active element that overlies a designated segment of the plurality of segments, the intracavity active element being optically coupled to the designated segment;
a plurality of total internal reflection (TIR) mirrors, a number of TIR mirrors in the plurality of TIR mirrors being equal to a number of segments in the plurality of segments; and
a photo-tunneling input output (I/O) port that comprises a designated TIR mirror of the plurality of TIR mirrors,
wherein the plurality of segments of the optical waveguide is arranged as a closed loop, the TIR mirrors connecting segment ends of respective successive pairs of the segments of the optical waveguide.

14. The photonic system of claim 13, wherein the optical source comprises the intracavity active element, the photo-tunneling I/O port being an output port for the optical signal.

15. The photonic system of claim 13, wherein the optical signal is coupled into the optical resonator through one of the photo-tunneling I/O port and another port of the resonator, and wherein the intracavity active element optically amplifies the optical signal.

16. The photonic system of claim 13, wherein the designated segment of the optical waveguide comprises a reverse ridge-loaded slab optical waveguide within a substrate adjacent to a surface of the substrate, and wherein the intracavity active element comprises a semiconductor layer affixed to the surface of the substrate that overlies a portion of the reverse ridge-loaded slab optical waveguide.

17. A method of optical resonance comprising:
propagating an optical signal along a plurality of segments of an optical waveguide, the segments of the plurality being arranged as a closed loop forming a ring resonator, successive pairs of the segments being connected to one another at respective segment ends by successive ones of an equivalent plurality of total internal reflection (TIR) mirrors;
reflecting a portion of the optical signal at the TIR mirrors of the equivalent plurality;
influencing the optical signal within an intracavity active element that overlies a designated segment of the plurality of segments; and
transmitting a portion of the optical signal out of the ring resonator through a photo-tunneling input/output (I/O)

port, the photo-tunneling I/O port comprising a designated one of the TIR mirrors of the equivalent plurality.

18. The method of optical resonance of claim 17, wherein influencing the optical signal comprises:
- coupling a portion of the optical signal from the designated segment of the optical waveguide into the overlying intracavity active element;
- amplifying the coupled portion of the optical signal within the intracavity active element; and
- coupling the amplified portion of the optical signal back into the designated segment.

19. The method of optical resonance of claim 18, wherein the designated segment comprises a reverse ridge-loaded slab optical waveguide within a substrate adjacent to a surface of the substrate, the intracavity active element comprising a semiconductor layer that is wafer bonded to the substrate surface, and
- wherein propagating an optical signal comprises propagating a portion of a propagating mode of the optical signal within the designated segment that extends into the overlying intracavity active element, and
- wherein influencing the optical signal comprises amplifying the portion of the propagating mode within the intracavity active element.

20. An optical waveguide ring resonator comprising:
- a segment of reverse ridge-loaded slab optical waveguide, the reverse ridge-loaded slab optical waveguide comprising a layer of a first semiconductor material adjacent to a surface of a substrate; and
- an intracavity active element overlying and being optically coupled to the segment, the intracavity active element comprising a layer of a second semiconductor material bonded to the substrate surface, the second semiconductor material differing from and being lattice mismatched with the first semiconductor material,
- wherein a portion of an optical signal propagating in the segment is optically coupled to the intracavity active element, the portion of the optical signal extending out of the first semiconductor material layer and into the second semiconductor material layer such that the intracavity active element influences the optical signal.

* * * * *